United States Patent
Ishizaka et al.

(10) Patent No.: US 7,718,527 B2
(45) Date of Patent: May 18, 2010

(54) METHOD FOR FORMING COBALT TUNGSTEN CAP LAYERS

(75) Inventors: Tadahiro Ishizaka, Watervliet, NY (US); Shigeru Mizuno, Delmar, NY (US); Miho Jomen, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/242,914

(22) Filed: Oct. 1, 2008

(65) Prior Publication Data

US 2010/0081276 A1    Apr. 1, 2010

(51) Int. Cl.
*H01L 21/4763* (2006.01)
(52) U.S. Cl. .................. 438/627; 438/629; 438/637; 438/638; 438/642; 438/643; 257/E23.001; 257/E23.151; 257/E23.175; 257/E21.579
(58) Field of Classification Search ............... 438/618, 438/622–629, 637, 638, 641–644, 648, 653, 438/656, 685, 687; 257/E23.001, E23.151, 257/E23.175, E21.579
See application file for complete search history.

(56) References Cited

U.S. PATENT DOCUMENTS

| | | |
|---|---|---|
| 6,444,263 B1 | 9/2002 | Paranjpe |
| 6,833,625 B1 | 12/2004 | Wang |
| 2002/0192947 A1* | 12/2002 | Gavish et al. ............... 438/637 |
| 2003/0203617 A1 | 10/2003 | Lane |
| 2005/0181598 A1 | 8/2005 | Kailasam |
| 2006/0113675 A1 | 6/2006 | Chang |
| 2006/0216920 A1* | 9/2006 | Kojima ..................... 438/618 |
| 2006/0216929 A1* | 9/2006 | Park et al. .................. 438/637 |
| 2006/0249849 A1 | 11/2006 | Cohen |
| 2009/0065946 A1* | 3/2009 | Kojima ..................... 257/773 |

OTHER PUBLICATIONS

M.E. Gross et al, Journal of Vacuum Science and Technology B, American Vacuum Society, pp. 1548-1552, vol. 6, 1988.

T. Maruyama et al., Cobalt Thin Films Prepared by Chemical Vapor Deposition from Cobaltous Acetate, Applied Physics Letters, American Institute of Physics, Melville, NY, Sep. 16, 1991, pp. 1433-1434, vol. 59.

G.J.M. Dormans, OMCVD of Transition Metal and Their Silicides using Metallocenes and (Di)silane or Silicon Tetra-bromide, Journal of Crystal Growth, Elsevier Science Publishers B.V. (North Holland), pp. 806-816, vol. 108, 1991.

A.R. Ivanova et al., The Effects of Processing Parameters in the Chemical Vapor Deposition of Cobalt from Cobalt Tricarbonyl Nitrosyl, Journal of The Electrochemical Society, The Electrochemical Society, pp. 2139-2145, vol. 146, No. 6, 1999.

(Continued)

*Primary Examiner*—Hsien-ming Lee

(57) ABSTRACT

A method is provided for integrating cobalt tungsten cap layers into manufacturing of semiconductor devices to improve electromigration and stress migration in copper (Cu) metal. One embodiment includes providing a patterned substrate containing a recessed feature formed in a low-k material and a first metallization layer at the bottom of the feature, forming a cobalt tungsten cap layer on the first metallization layer, depositing a barrier layer in the recessed feature, including on the low-k dielectric material and on the first cobalt metal cap layer, and filling the recessed feature with Cu metal. Another embodiment includes providing a patterned substrate having a substantially planar surface with Cu paths and low-k regions, and forming a cobalt tungsten cap layer on the Cu paths.

27 Claims, 6 Drawing Sheets

OTHER PUBLICATIONS

B.S. Lim et al., Atomic Layer Deposition of Transition Metals, Nature Materials, Nature Publishing Group, pp. 749-754, vol. 2, 2003.

S.B. Kang et al., CVD-Cobalt for the Next Generation of Source/Drain Salicidation and Contact Silicidation in Novel MOS Device Structures with Complex Shape, IEEE International Electron Devices Meeting (IEDM), Washington DC, Dec. 8-10, 2003, 4 pgs.

H. Bhandari et al., Vapor Deposition of Barrier/Adhesion/Seed Layers for Copper Interconnects, Materials Research Society, Spring Meeting, Mar. 25-27, 2008. Abstract only.

H.S. Rhee et al., Cobalt Metallorganic Chemical Vapor Deposition and Formation of Epitaxial CoSi2 Layer on Si(100) Substrate, Journal of The Electrochemical Society, The Electrochemical Society, Inc., pp. 2720-2724, vol. 146, No. 7, 1999.

A.R. Londergan et al., Interlayer Mediated Epitaxy of Cobalt Silicide on Silicon(100) from Low Temperature Chemical Vapor Deposition of Cobalt, Journal of The Electrochemical Society, The Electrochemical Society, Inc., pp. C21-C27, vol. 148, No. 1, 2001.

K. Kim, Characteristics of Cobalt Thin Films Deposited by Remote Plasma ALD Method with Dicobalt Octacarbonyl, Journal of The Electrochemical Society, The Electrochemical Society, Inc., pp. H177-H181, vol. 154, No. 3, 2007.

J. Lee et al., Highly Conformal Deposition of Pure Co Films by MOCVD Using Co2(CO)8 as a Precursor, Journal of The Electrochemical Society, The Electrochemical Society, Inc., pp. G539-G542, vol. 153, No. 6, 2006.

K. Lee et al, Characteristics of Ti-Capped Co Films Deposited by a Remote Plasma ALD Method Using Cyclopentadienylcobalt Dicarbonyl, Journal of The Electrochemical Society, The Electrochemical Society, Inc., pp. H899-H903, vol. 154, No. 10, 2007.

G.J.M. Dormans et al., OMCVD of Cobalt and Cobalt Silicide, Journal of Crystal Growth, Elsevier Science Publishers B.V. (North Holland), pp. 364-372, vol. 114, 1991.

F. Maury et al., Epitaxial Growth of CoGa on GaAs by Organometallic Chemical Vapor Deposition, Chemistry of Materials, American Chemical Society, pp. 84-89, vol. 5, 1993.

Z. Li et al., Nucleation and Adhesion of ALD Copper on Cobalt Adhesion Layers and Tungsten Diffusion Barriers, Electrochemical and Solid-State Letters, The Electrochemical Society, Inc., pp. G182-G185, vol. 8, No. 7, 2005.

J. Koike et al., Cu Alloy Metallization for Self-forming Barrier Process, Interconnect Technology Conference, Jun. 2006, p. 161-163.

Iijima et al., Growth Behaviour of Self-Formed Barrier Using Cu-Mn Alloys at 350 to 600C, Interconnect Technology Conference, Jun. 2006, p. 155-157.

Gossett et al., Self Aligned Barrier Approach: Overview on Process, Module Integration and Interconnect Performance Improvement Challenges, Interconnect Technology Conference, Jun. 2006, p. 84-86.

* cited by examiner

METHOD FOR FORMING COBALT TUNGSTEN CAP LAYERS

CROSS-REFERENCE TO RELATED APPLICATION

The present invention is related to U.S. patent application Ser. No. 12/242,900, entitled "METHOD FOR FORMING COBALT NITRIDE CAP LAYERS", filed on Sep. 30, 2008, the entire contents of which is hereby incorporated by reference.

FIELD OF THE INVENTION

The present invention relates to semiconductor processing and semiconductor devices, and more particularly, to a method of integrating cobalt tungsten films into the manufacturing of semiconductor devices.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with metal, provides an electrical connection through the dielectric layer to a conductive layer underlying the dielectric layer. Similarly, recessed features connecting two or more vias are normally referred to as trenches.

The use of copper (Cu) metal in multilayer metallization schemes for manufacturing integrated circuits has created several problems that require solutions. For example, high mobility of Cu atoms in dielectric materials and Si can result in migration of Cu atoms into those materials, thereby forming electrical defects that can destroy an integrated circuit. Therefore, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, can provide good adhesion to the dielectrics materials and can offer low electrical resistivity.

The electrical current density in an integrated circuit's interconnects significantly increases for each successive technology node. Because electromigration (EM) and stress migration (SM) lifetimes are inversely proportional to current density, EM and SM have fast become critical challenges. EM lifetime in Cu dual damascene interconnect structures is strongly dependent on atomic Cu transport at the interfaces of bulk Cu metal and surrounding materials (e.g., capping layer) which is directly correlated to adhesion at these interfaces. New capping materials that provide better adhesion and better EM lifetime have been studied extensively. For example, a cobalt-tungsten-phosphorus (CoWP) layer has been selectively deposited on bulk Cu metal using an electroless plating technique. The interface of CoWP and bulk Cu metal has superior adhesion strength that yields longer EM lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of CoWP.

Therefore, new methods are required for depositing metal-containing cap layers that provide good adhesion to Cu, improved EM and SM properties of bulk Cu metal, and provide good chemical resistance to wet processing steps. Furthermore, these methods should provide good selectivity for metal-containing cap layer deposition on metal surfaces compared to dielectric surfaces.

SUMMARY OF THE INVENTION

Embodiments of the invention provide a method for integrating cobalt tungsten cap layers into manufacturing of semiconductor devices to improve electromigration and stress migration in Cu metallization. The cobalt metal element provides enhanced adhesion properties to Cu metal and the tungsten element provides enhanced diffusion barrier properties against Cu metal diffusion into dielectric materials.

According to one embodiment of the invention, the method includes providing a patterned substrate containing a recessed feature formed in a low dielectric constant (low-k) dielectric material and a first metallization layer at the bottom on the recessed feature, forming a first cobalt tungsten cap layer on the first metallization layer using a first cobalt precursor gas and a first tungsten precursor gas, depositing a barrier layer in the recessed feature, including on the low-k dielectric material and on the first cobalt tungsten cap layer; and filling the recessed feature with Cu metal. According to another embodiment of the invention, the method further includes, following the filling, forming a substantially planar surface with Cu paths and low-k dielectric regions, and forming a second cobalt tungsten cap layer on the Cu paths.

According to an embodiment of the invention, the method includes providing a patterned substrate having a substantially planar surface with Cu paths and low-k dielectric regions, and forming a cobalt tungsten cap layer on the Cu paths by exposing the patterned substrate to a deposition gas comprising a cobalt precursor gas and a tungsten precursor gas.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide a method for integrating cobalt tungsten (CoW) cap layers into Cu metallization of semiconductor devices to improve electromigration (EM) and stress migration (SM) in the devices and provide good chemical resistance to wet processing steps. The method can provide selectivity for cobalt tungsten cap layer deposition on metal surfaces such as Cu paths relative to dielectric surfaces between the Cu paths that results in improved margin for line-to-line breakdown and electrical leakage performance.

One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

Embodiments of the invention provide a method for selective deposition of cobalt tungsten films on metal surfaces (e.g., Cu metal) on patterned substrates containing low-k materials. The patterned substrates can contain high-aspect-ratio recessed features in a low-k dielectric material that are at least substantially filled with Cu metal, thus forming Cu paths in the recessed features. According to one embodiment of the invention, a recessed feature can include a dual damascene interconnect structure containing a trench and a via formed in the patterned low-k dielectric material. The via can have an aspect ratio (depth/width) greater than or equal to about 2:1, for example 3:1, 4:1, 5:1, 6:1, 12:1, 15:1, or higher. The via can have widths of about 200 nm or less, for example 150 nm, 100 nm, 65 nm, 45 nm, 32 nm, 20 nm, or lower. However, embodiments of the invention are not limited to these aspect ratios or via widths, as other aspect ratios or via widths may be utilized.

Figure 1A:
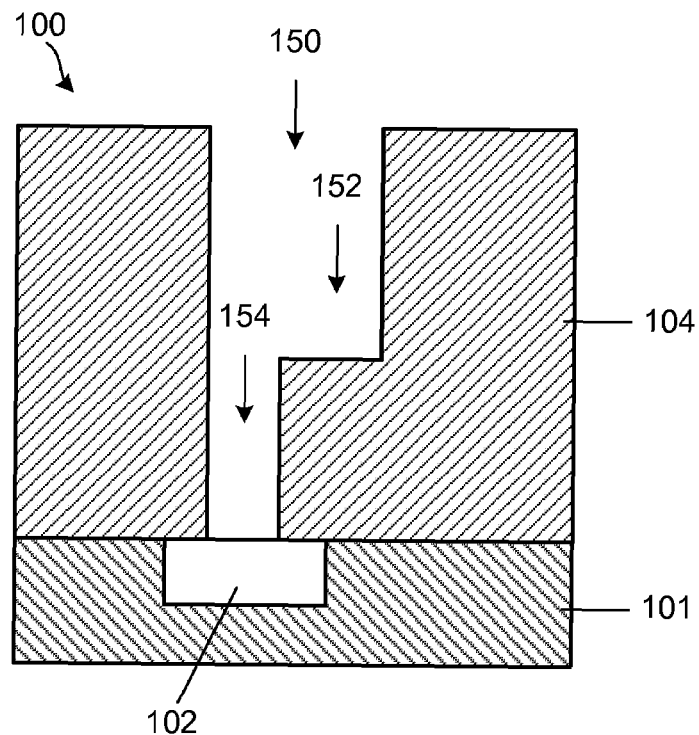
FIGS. 1A-1F show schematic cross-sectional views of integration of cobalt tungsten cap layers in a dual damascene interconnect structure according to embodiments of the invention.

FIGS. 1A-1E show schematic cross-sectional views of integration of cobalt tungsten films in a dual damascene interconnect structure according to embodiments of the invention. FIG. 1A shows a schematic cross-sectional view of a patterned substrate containing a dual damascene interconnect structure 100 according to an embodiment of the invention. The dual damascene interconnect structure 100 can be formed using standard lithography and etching methods known to those skilled in the art. It will be understood that embodiments of the invention may also be applied to simpler or more complicated dual damascene interconnect structures and other types of recessed features formed in low-k dielectric materials.

In FIG. 1A, the dual damascene interconnect structure 100 comprises a recessed feature 150 containing a trench 152 and a via 154 etched in a low-k dielectric material 104. Furthermore, the dual damascene interconnect structure 100 contains a first metallization layer 102 (e.g., Cu metal, tungsten (W) metal, or aluminum (Al) metal) at the bottom of the via 154. The low-k dielectric material 104 contains a dielectric material having a lower dielectric constant than $SiO_2$ (k~3.9). The low-k dielectric material can include BLACK DIAMOND® II (BDII) SiCOH material, commercially available from Applied Materials of Santa Clara, Calif. Other low-k dielectric materials that may be used include fluorinated silicon glass (FSG), carbon doped oxide, a polymer, a SiCOH-containing low-k material (e.g., F—SiCOH), a non-porous low-k material, a porous low-k material, a low-k material deposited by chemical vapor deposition (CVD), or a spin-on dielectric (SOD) low-k material. In addition to BD II, other carbon-containing materials are commercially available, including Silk® and Cyclotene® (benzocyclobutene) available from Dow Chemical. Other suitable low-k dielectric material may be used. Although not shown, the interconnect structure 100 may contain additional layers, for example a trench etch stop layer, a via etch stop layer between dielectric materials 101 and 104, and a barrier layer separating the first metallization layer 102 from the dielectric materials 101 and 104.

According to one embodiment of the invention, the patterned substrate depicted in FIG. 1A may be treated with a thermally excited (non-plasma) or plasma excited process gas containing $H_2$, $NH_3$, $N_2$, $NH(CH_3)_2$, $N_2H_4$, $N_2H_3CH_3$, or $SiH_4$, or a combination thereof.

According to one embodiment, the patterned substrate may be treated with $NH_x$ ($x \leq 3$) radicals and H radicals formed in a plasma processing chamber from a process gas comprising $NH_3$. In one example, the plasma processing chamber may be process chamber 10 of processing system 1 depicted in FIG. 5. The treating can be performed at a substrate temperature below 500° C., for example between 150° C. and 400° C., and may further include a noble gas such as argon (Ar). In one example, pure $NH_3$ may be used. In one example, a 10:1 $NH_3$/Ar mixture may be used. In one example, the process gas pressure in the plasma processing chamber is greater than 1 Torr, for example 2 Torr, 3 Torr, or greater than 3 Torr. In one example, plasma is generated in the plasma processing chamber by applying radio frequency (RF) power of less than 100 W to a substrate holder configured to support the substrate (wafer). The RF power can, for example, include 90, 80, 70, 60, 50, or even less than 50 Watts (W). In one example, according to embodiments of the invention, during the treating, plasma conditions may be selected such that exposure of the substrate to ions formed in the plasma is suppressed. This may be achieved using low plasma power and high process gas pressure that exposes the substrate to $NH_x$ ($x \leq 3$) radicals and H radicals, but suppresses exposure of the substrate to ions formed in the plasma.

Figure 1B:
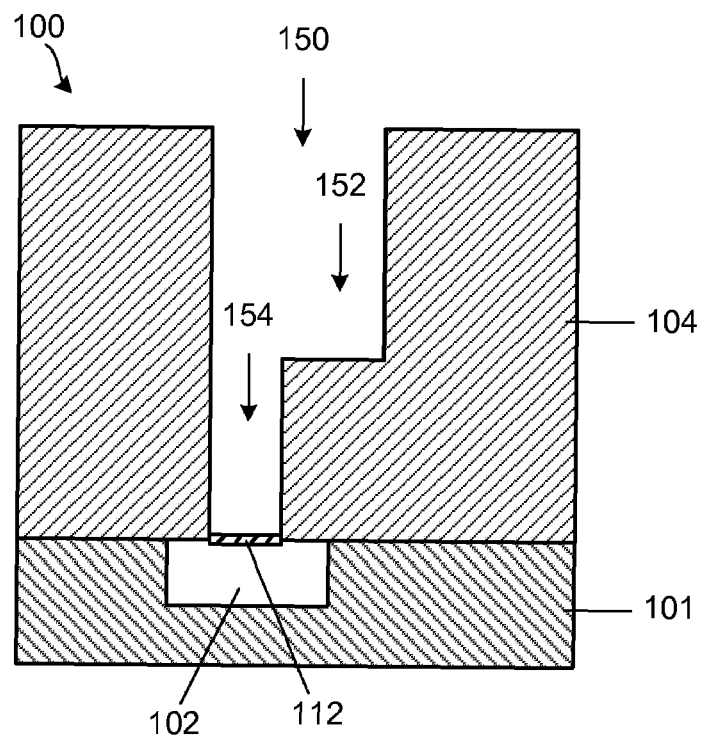

Following the treating of the patterned substrate, a first cobalt tungsten cap layer 112 may be formed on the first metallization layer 102 as shown in FIG. 1B. The first cobalt tungsten cap layer 112 may be formed in a vapor deposition process selected from CVD, plasma-enhanced CVD (PECVD), atomic layer deposition (ALD), or plasma-enhanced ALD (PEALD). The first cobalt tungsten cap layer 112 may be formed using a cobalt precursor gas and a tungsten precursor gas. According to one embodiment, the first cobalt precursor gas can contain a cobalt carbonyl precursor gas (e.g., $Co_2(O)_8$, $Co_4(CO)_{12}$) and the first tungsten precursor gas can contain a tungsten carbonyl precursor gas (e.g., $W(CO)_6$). In addition, a reducing gas may be used to aid in the deposition process. Alternately, other deposition processes may be utilized to deposit the first cobalt tungsten cap layer 112.

According to some embodiments of the invention, the first cobalt tungsten cap layer 112 may contain a substantially homogeneous mixture of cobalt and tungsten, a graded cobalt tungsten mixture, or alternating cobalt and tungsten layers, or a combination thereof. Examples of a first cobalt tungsten cap layer 112 are depicted in FIGS. 3A-3D.

Figure 3A:
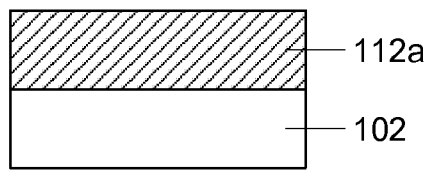
FIGS. 3A-3D show simplified schematic cross-sectional views of cobalt tungsten cap layers on a first metallization layer according to embodiments of the invention.

FIGS. 3A-3D show simplified schematic cross-sectional views of cobalt tungsten cap layers on a first metallization layer according to embodiments of the invention. FIG. 3A shows a schematic cross-sectional view of a first cobalt tungsten cap layer 112a on a first metallization layer 102 according to one embodiment. The first cobalt tungsten cap layer 112a can contain a substantially homogeneous cobalt tungsten mixture. The first cobalt tungsten cap layer 112a may be deposited by simultaneously exposing the first metallization layer 102 to a first cobalt precursor gas and a first tungsten precursor gas in a deposition process.

Figure 3B:
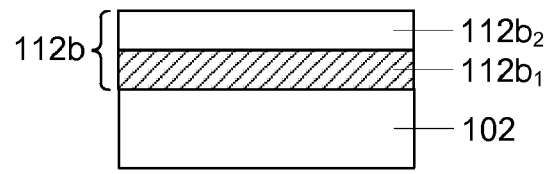

FIG. 3B shows a schematic cross-sectional view of a first cobalt tungsten cap layer 112b on a first metallization layer 102 according to another embodiment. The first cobalt tungsten cap layer 112b may contain a cobalt metal layer 112b$_1$ on the first metallization layer 102 and a tungsten metal layer 112b$_2$ on the cobalt metal layer 112b$_1$. The cobalt metal layer 112b$_1$ may be formed by exposing the first metallization layer 102 to a first cobalt precursor gas, and subsequently, the tungsten metal layer 112b$_2$ may be deposited by exposing the cobalt metal layer 112b$_1$ to a first tungsten precursor gas. According to other embodiments, the first cobalt tungsten cap layer 112b may contain additional alternating cobalt metal layers 112b$_1$ and tungsten metal layers 112b$_2$.

According to one embodiment, the first cobalt tungsten cap layer 112b may contain a cobalt metal layer 112b$_1$ on the first metallization layer 102 and a cobalt-rich cobalt tungsten layer 112b$_2$ on the cobalt metal layer 112b$_1$. The cobalt-rich cobalt tungsten layer 112b$_2$ can have a tungsten content less than 50, 40, 30, 20, 10, or 5 atomic percent, and balance cobalt.

According to one embodiment, the first cobalt tungsten cap layer 112b may contain a cobalt metal layer 112b$_1$ on the first metallization layer 102 and a tungsten-rich cobalt tungsten layer 112b$_2$ on the cobalt metal layer 112b$_1$. The tungsten-rich cobalt tungsten layer 112b$_2$ can have a cobalt content less than 50, 40, 30, 20, 10, or 5 atomic percent, and balance tungsten.

Figure 3C:
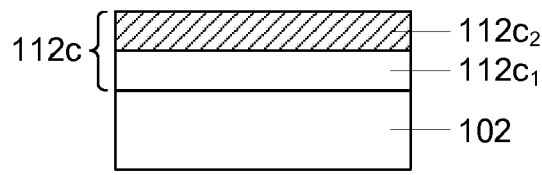

FIG. 3C shows a schematic cross-sectional view of a first cobalt tungsten cap layer 112c on a first metallization layer 102 according to another embodiment. The first cobalt tungsten cap layer 112c may contain a tungsten metal layer 112c$_1$ on the first metallization layer 102 and a cobalt metal layer 112c$_2$ on the tungsten metal layer 112c$_1$. The tungsten metal layer 112c$_1$ may be formed by exposing the first metallization layer 102 to a tungsten precursor gas, and subsequently, the cobalt metal layer 112c$_2$ may be deposited by exposing the tungsten metal layer 112c$_1$ to a cobalt precursor gas. According to other embodiments, the first cobalt tungsten cap layer 112c may contain additional alternating tungsten metal layers 112c$_1$ and cobalt metal layers 112c$_2$.

According to one embodiment, the first cobalt tungsten cap layer 112c may contain a tungsten metal layer 112c$_1$ on the first metallization layer 102 and a cobalt-rich cobalt tungsten layer 112c$_2$ on the tungsten metal layer 112c$_1$. The cobalt-rich cobalt tungsten layer 112c$_2$ can have a tungsten content less than 50, 40, 30, 20, 10, or 5 atomic percent, and balance cobalt.

According to one embodiment, the first cobalt tungsten cap layer 112c may contain a tungsten metal layer 112c$_1$ on the first metallization layer 102 and a tungsten-rich cobalt tungsten layer 112c$_2$ on the tungsten metal layer 112c$_1$. The tungsten-rich cobalt tungsten layer 112c$_2$ can have a cobalt content less than 50, 40, 30, 20, 10, or 5 atomic percent, and balance tungsten.

Figure 3D:
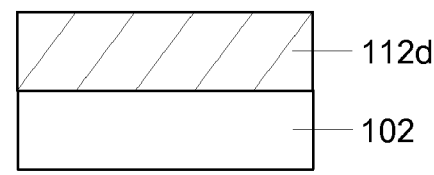

FIG. 3D shows a schematic cross-sectional view of a first cobalt tungsten cap layer 112d on a first metallization layer 102 according to still another embodiment. The first cobalt tungsten cap layer 112d may have a varying cobalt/tungsten ratio from an external surface of the first cobalt tungsten cap layer 112d to an interface between the first cobalt tungsten cap layer 112d and the first metallization layer 102. In some examples, the cobalt/tungsten ratio may increase or decrease from a first cobalt/tungsten ratio at an external surface of the first cobalt tungsten cap layer 112d to a second cobalt/tungsten ratio at an interface between the first cobalt tungsten cap layer 112d and the first metallization layer 102. For example, the first cobalt tungsten cap layer 112d may be deposited by varying a ratio of a flow rate of the first cobalt precursor gas to a flow rate of the first tungsten precursor gas in a first deposition gas from a first ratio to a second ratio different than the first ratio.

According to other embodiments, the first cobalt tungsten cap layer 112 depicted in FIG. 1B may contain any combinations of the first cobalt tungsten cap layers 112a-112d depicted in FIGS. 3A-3D. For example, the first cobalt tungsten cap layer 112 may contain the first cobalt tungsten cap layers 112a and 112d in any order on the first metallization layer 102.

According to embodiments of the invention, the first cobalt tungsten cap layer 112 in FIG. 1B and the first cobalt tungsten cap layers 112a-112d in FIGS. 3A-3D may consist essentially of cobalt and tungsten.

Referring back to FIG. 1B, according to one embodiment, the first cobalt tungsten cap layer 112 may be nitrided by exposing the first cobalt tungsten cap layer 112 to a first nitriding gas. The first nitriding gas can contain a thermally excited or plasma excited first nitriding gas selected from $NH_3$, $N_2$, $N_2+H_2$, $NH(CH_3)_2$, $N_2H_4$, or $N_2H_3CH_3$, or a combination thereof.

According to one embodiment of the invention, the first cobalt tungsten cap layer 112 may be selectively deposited on the first metallization layer 102 as depicted in FIG. 1B. Selective deposition of the first cobalt tungsten cap layer 112 on the first metallization layer 102 relative to the low-k dielectric material 104 is enabled by a lack of or low concentration of metal precursor (e.g., cobalt or tungsten precursor) adsorption sites on the low-k dielectric material 104 compared to on the first metallization layer 102. This leads to a short incubation time for deposition of the first cobalt tungsten cap layer 112 on the first metallization layer 102 relative to the low-k dielectric material 104.

In one example, an average thickness of the first cobalt tungsten cap layer 112 can be between 5 angstrom (angstrom=$10^{-10}$ m) and 50 angstrom, for example about 5, 10, 15, 20, 30, 40, or 50 angstrom. In some examples, the first cobalt tungsten cap layer 112 may have an average thickness between 2 and 5 angstrom. However, embodiments of the invention are not limited to those thicknesses and a first cobalt tungsten cap layer 112 that is thicker than 50 angstrom may be formed and utilized. According to one embodiment, a surface coverage of the first cobalt tungsten cap layer 112 on the first metallization layer 102 may be incomplete with gaps that expose the first metallization layer 102. According to one embodiment, the treating of the patterned substrate and the subsequent deposition of the first cobalt tungsten film may be performed in the same process chamber. Alternately, the treating and subsequent cobalt tungsten film deposition may be performed in different process chambers.

Figure 1C:
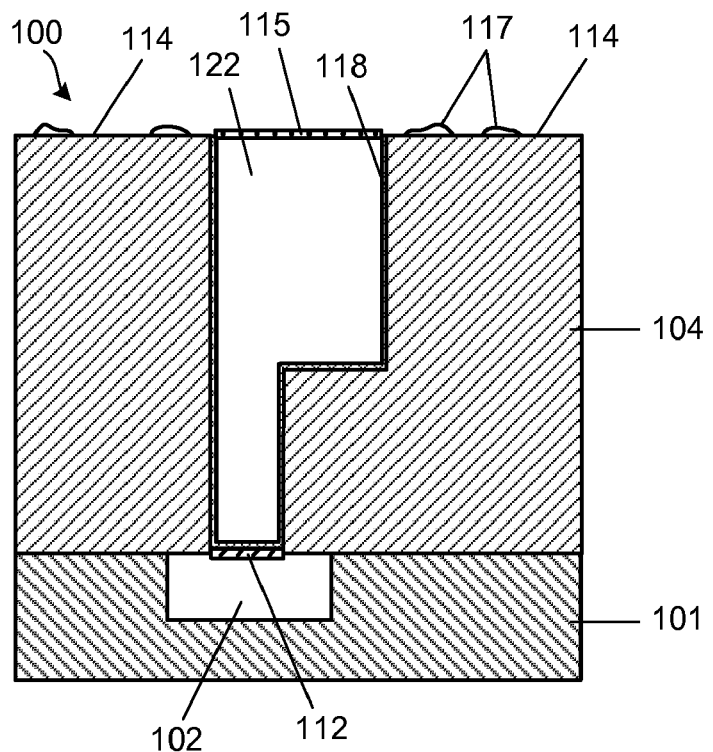

FIG. 1C schematically shows a barrier layer 118 is formed in the recessed feature 150 and a planarized Cu path 122 formed on the barrier layer 118 in the recessed feature 150. The planarized Cu path 122 can be formed by filling the recessed feature 150 with bulk Cu metal and removing excess Cu metal using a planarizing process, for example a chemical mechanical polishing (CMP) process. The planarization process further removes the barrier layer 118 from the low-k dielectric regions 114 of the low-k dielectric material 104 as schematically shown in FIG. 1C. Bulk Cu metal deposition processes are well known to one of ordinary skill in the art of circuit fabrication and can, for example, include an electrochemical plating process or an electroless plating process. Furthermore, CMP processes are well known to one of ordinary skill in the art. Although only a single Cu path 122 is depicted in FIG. 1C, those skilled in the art will readily recognize that semiconductor devices contain a plurality of Cu paths 122.

The barrier layer 118 can, for example, contain a Ta-containing material (e.g., Ta, TaC, TaN, or TaCN, or a combination thereof), a Ti-containing material (e.g., Ti, TiN, or TiCN, or a combination thereof), or a W-containing material (e.g., W, WN, or a combination thereof). In one example, the barrier layer 118 may contain TaCN deposited in a plasma enhanced atomic layer deposition (PEALD) system using alternating exposures of tertiary amyl imido-tris-dimethylamido tantalum $(Ta(NC(CH_3)_2C_2H_5)(N(CH_3)_2)_3)$ and $H_2$. In another example, the barrier layer 118 may contain a ruthenium (Ru) metal layer formed on a Ta-containing layer or on a Ti-containing layer, e.g., Ru/TaN, Ru/TaCN, Ru/TiN, or Ru/TiCN. In yet another example, the barrier layer 118 may contain a mixture of Ru and a Ta-containing material or a mixture of Ru and a Ti-containing material, e.g., RuTaN, RuTaCN, RuTiN, or RuTiCN. In still another example, the barrier layer 118 may contain a cobalt metal layer formed on a Ta-containing layer or on a Ti-containing layer, e.g., Co/TaN, Co/TaCN, Co/TiN, or Co/TiCN. In yet another example, the barrier layer 118 may contain a mixture of Co and a Ta-containing material or a mixture of Co and a Ti-containing material, e.g., CoTaN, CoTaCN, CoTiN, or CoTiCN.

Still referring to FIG. 1C, the low-k dielectric regions 114 contain residues 117 and a copper oxide layer 115 formed on the Cu path 122. The residues 117 and the copper oxide layer 115 may be formed by a CMP process. The residues 117 may include benzotriazine (BTA) that is a chemical agent commonly used in a CMP process. According to another embodiment, the residues 117, the copper oxide layer 115, or both the residues 117 and the copper oxide layer 115 may be absent from the interconnect structure 100 in FIG. 1C.

Figure 1D:
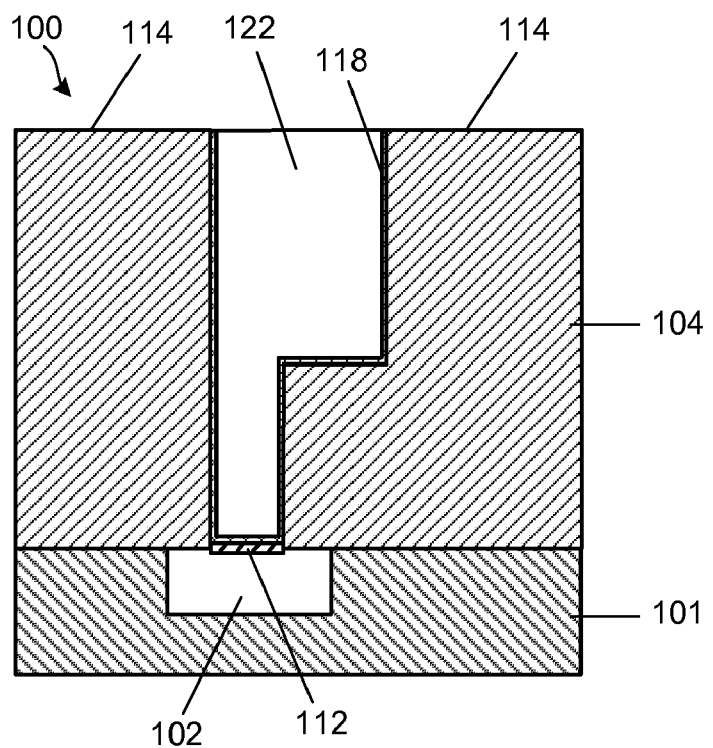

According to one embodiment of the invention, following formation of the dual damascene interconnect structure 100 in FIG. 1C, the planarized bulk Cu path 122 and the low-k dielectric regions 114 may be treated with thermally excited or plasma excited process gas containing $H_2$, $NH_3$, $N_2$, $NH(CH_3)_2$, $N_2H_4$, $N_2H_3CH_3$, or $SiH_4$, or a combination thereof. The treating is effective in removing the residues 117 and the copper oxide layer 115 from the patterned substrate, as depicted in FIG. 1D.

According to one embodiment, the patterned substrate in FIG. 1C may be treated with $NH_x$ ($x \leq 3$) radicals and H radicals formed from a process gas comprising $NH_3$. In one example, the plasma processing chamber may be process chamber 10 of processing system 1 depicted in FIG. 5. The treating can be performed at a substrate temperature below 500° C., for example between 150° C. and 400° C., and may further include a noble gas such as argon (Ar). In one example, pure $NH_3$ may be used. In one example, a 10:1 $NH_3$/Ar mixture may be used. In one example, the process gas pressure in the plasma processing chamber is greater than 1 Torr, for example 2 Torr, 3 Torr, or greater than 3 Torr. In one example, plasma is generated in the plasma processing chamber by applying RF power of less than 100 W to a substrate holder configured to support the substrate (wafer). The RF power can, for example, include 90, 80, 70, 60, 50, or even less than 50 W. According to embodiments of the invention, during the treating, plasma conditions may be selected such that exposure of the substrate to ions formed in the plasma is suppressed. This may be achieved using low plasma power and high process gas pressure that exposes the substrate to $NH_x$ ($x \leq 3$) radicals and H radicals, but suppresses exposure of the substrate to ions formed in the plasma.

Figure 1E:
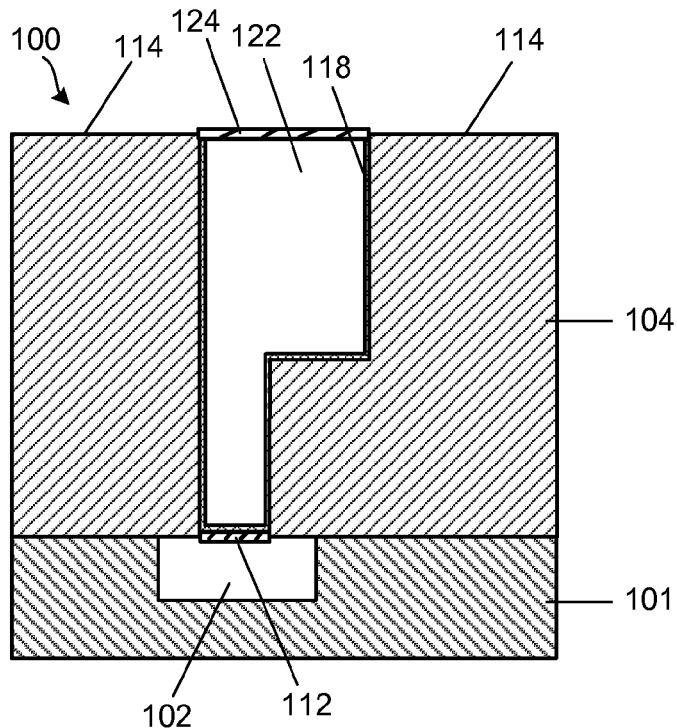

Following the treating, a second cobalt tungsten cap layer 124 may be formed on the Cu path 122 as shown in FIG. 1E. The second cobalt tungsten cap layer 124 may be formed in a vapor deposition process selected from CVD), PECVD, ALD, or PEALD. The second cobalt tungsten cap layer 124 may be formed using a second cobalt precursor gas and a second tungsten precursor gas. According to one embodiment, the second cobalt precursor gas can contain a cobalt carbonyl precursor gas (e.g., $CO_2(CO)_8$, $CO_4(CO)_{12}$) and the first tungsten precursor gas can contain a tungsten carbonyl precursor gas (e.g., $W(CO)_6$). In addition, a reducing gas may be used to aid in the deposition process. Alternately, other deposition processes may be utilized to deposit the second cobalt tungsten cap layer 124.

According to some embodiments of the invention, the second cobalt tungsten cap layer 124 may contain a substantially homogeneous mixture of cobalt and tungsten, a graded cobalt tungsten mixture, or alternating cobalt and tungsten layers, or a combination thereof. Examples of a second cobalt tungsten cap layer 124 are depicted in FIGS. 4A-4D.

Figure 4A:
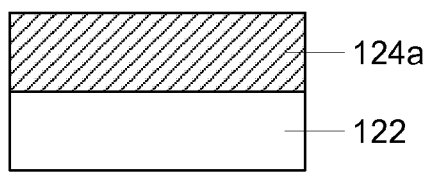
FIGS. 4A-4D show simplified schematic cross-sectional views of cobalt tungsten cap layers on a Cu path according to embodiments of the invention.

FIGS. 4A-4D show simplified schematic cross-sectional views of cobalt tungsten cap layers on Cu paths according to embodiments of the invention. FIG. 4A shows a schematic cross-sectional view of a second cobalt tungsten cap layer 124a on Cu path 122 according to one embodiment. The second cobalt tungsten cap layer 124a can contain a substantially homogeneous cobalt tungsten mixture. The second cobalt tungsten cap layer 124a may be deposited by simultaneously exposing the Cu path 122 to a second cobalt precursor gas and a second tungsten precursor gas in a deposition process.

Figure 4B:
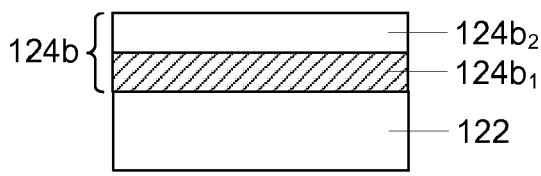

FIG. 4B shows a schematic cross-sectional view of a second cobalt tungsten cap layer 124b on Cu path 122 according to another embodiment. The second cobalt tungsten cap layer 124b may contain a cobalt metal layer 124b_1 on the Cu path 122 and a tungsten metal layer 124b_2 on the cobalt metal layer 124b_1. The cobalt metal layer 124b_1 may be formed by exposing the Cu path 122 to a second cobalt precursor gas, and subsequently, the tungsten metal layer 124b_2 may be deposited by exposing the cobalt metal layer 124b_1 to a second tungsten precursor gas. According to other embodiments, the second cobalt tungsten cap layer 124b may contain additional alternating cobalt metal layers 124b_1 and tungsten metal layers 124b_2.

According to one embodiment, the second cobalt tungsten cap layer 124b may contain a cobalt metal layer 124$b_1$ on the Cu path 122 and a cobalt-rich cobalt tungsten layer 124$b_2$ on the cobalt metal layer 124$b_1$. The cobalt-rich cobalt tungsten layer 124$b_2$ can have a tungsten content less than 50, 40, 30, 20, 10, or 5 atomic percent, and balance cobalt.

According to one embodiment, the second cobalt tungsten cap layer 124b may contain a cobalt metal layer 124$b_1$ on the Cu path 122 and a tungsten-rich cobalt tungsten layer 124$b_2$ on the cobalt metal layer 124$b_1$. The tungsten-rich cobalt tungsten layer 124$b_2$ can have a cobalt content less than 50, 40, 30, 20, 10, or 5 atomic percent, and balance tungsten.

Figure 4C:
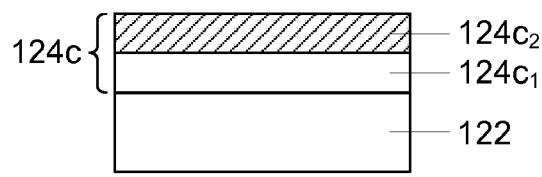

FIG. 4C shows a schematic cross-sectional view of a second cobalt tungsten cap layer 124c on a Cu path 122 according to another embodiment. The second cobalt tungsten cap layer 124c may contain a tungsten metal layer 124$c_1$ on the Cu path 122 and a cobalt metal layer 124$c_2$ on the tungsten metal layer 124$c_1$. The tungsten metal layer 124$c_1$ may be formed by exposing the Cu path 122 to a second tungsten precursor gas, and subsequently, the cobalt metal layer 124$c_2$ may be deposited by exposing the tungsten metal layer 124$C_1$ to a second cobalt precursor gas. According to other embodiments, the second cobalt tungsten cap layer 124c may contain additional alternating tungsten metal layers 124$c_1$ and cobalt metal layers 124$c_2$.

According to one embodiment, the second cobalt tungsten cap layer 124c may contain a tungsten metal layer 124$c_1$ on the Cu path 122 and a cobalt-rich cobalt tungsten metal layer 124$c_2$ on the tungsten metal layer 124$c_1$. The cobalt-rich cobalt tungsten layer 124$c_2$ can have a tungsten content less than 50, 40, 30, 20, 10, or 5 atomic percent, and balance cobalt.

According to one embodiment, the second cobalt tungsten cap layer 124c may contain a tungsten metal layer 124$c_1$ on the Cu path 122 and a tungsten-rich cobalt tungsten metal layer 124$c_2$ on the tungsten metal layer 124$c_1$. The tungsten-rich cobalt tungsten layer 124$c_2$ can have a cobalt content less than 50, 40, 30, 20, 10, or 5 atomic percent, and balance tungsten.

Figure 4D:
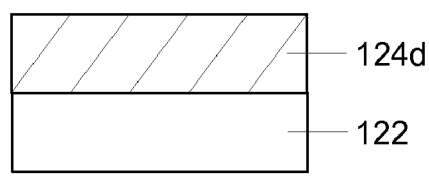

FIG. 4D shows a schematic cross-sectional view of a second cobalt tungsten cap layer 124d on a Cu path 122 according to still another embodiment. The second cobalt tungsten cap layer 124d may have a varying cobalt/tungsten ratio from an external surface of the second cobalt tungsten cap layer 124d to an interface between the second cobalt tungsten cap layer 124d and the Cu path 122. In some examples, the cobalt/tungsten ratio may increase or decrease from a first cobalt/tungsten ratio at an external surface of the second cobalt tungsten cap layer 124d to a second cobalt/tungsten ratio at an interface between the second cobalt tungsten cap layer 124d and the Cu path 122. For example, the second cobalt tungsten cap layer 124d may be deposited by varying a ratio of a flow rate of the second cobalt precursor gas to a flow rate of the second tungsten precursor gas in a second deposition gas from a first ratio to a second ratio different than the first ratio.

According to other embodiments, the second cobalt tungsten cap layer 124 depicted in FIG. 1E may contain any combinations of the second cobalt tungsten cap layers 124a-124d depicted in FIGS. 4A-4D. For example, the second cobalt tungsten cap layer 124 may contain the second cobalt tungsten cap layers 124a and 124d in any order on the Cu path 122.

According to embodiments of the invention, the second cobalt tungsten cap layer 124 in FIG. 1E and the second cobalt tungsten cap layers 124a-124d in FIGS. 4A-4D may consist essentially of cobalt and tungsten.

Referring back to FIG. 1E, according to one embodiment, the second cobalt tungsten cap layer 124 may be nitrided by exposing the second cobalt tungsten cap layer 124 to a second nitriding gas. The second nitriding gas can contain a thermally excited or plasma excited second nitriding gas selected from $NH_3$, $N_2$, $N_2+H_2$, $NH(CH_3)_2$, $N_2H_4$, or $N_2H_3CH_3$, or a combination thereof.

According to one embodiment of the invention, the second cobalt tungsten cap layer 124 may be selectively deposited on the Cu path 122 as depicted in FIG. 1E. Selective deposition of the second cobalt tungsten cap layer 124 on the Cu path 122 relative to the low-k dielectric material 104 is enabled by a lack of or low concentration of metal precursor (e.g., cobalt or tungsten precursor) adsorption sites on the low-k dielectric material 104 compared to on the Cu path 122. This leads to a short incubation time for deposition of the second cobalt tungsten cap layer 124 on the Cu path 122 first relative to the low-k dielectric material 104.

In one example, an average thickness of the second cobalt tungsten cap layer 124 can be between 5 angstrom and 50 angstrom, for example about 5, 10, 15, 20, 30, 40, or 50 angstrom. In some examples, the second cobalt tungsten cap layer 124 may have an average thickness between 2 and 5 angstrom. However, embodiments of the invention are not limited to those thicknesses and the second cobalt tungsten cap layer 124 that is thicker than 50 angstrom may be formed and utilized. According to one embodiment, a surface coverage of the second cobalt tungsten cap layer 124 on the Cu path 122 may be incomplete with gaps that expose the Cu path 122. According to one embodiment, the treating of the Cu path 122 and the subsequent deposition of the second cobalt tungsten cap layer 124 may be performed in the same process chamber. Alternately, the treating and subsequent cobalt tungsten film deposition may be performed in different process chambers.

Figure 1F:
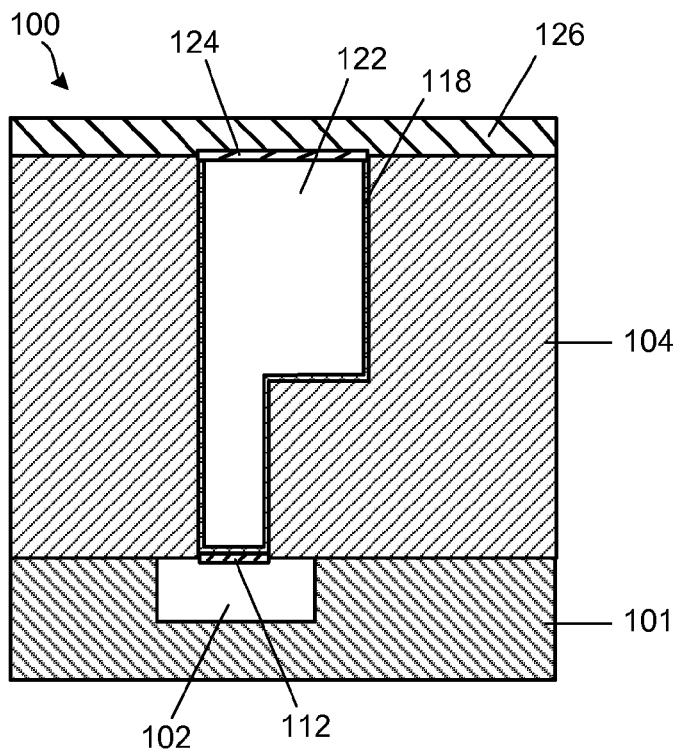

Following selective deposition of the second cobalt tungsten cap layer 124 on the Cu path 122, the partially manufactured semiconductor device depicted in FIG. 1E is further processed. FIG. 1F shows a conformal cap layer 126 deposited on the second cobalt tungsten cap layer 124 and on the low-k dielectric regions 114. The conformal cap layer 126 can, for example, contain silicon nitride or silicon carbon nitride. According to one embodiment of the invention, prior to depositing the cap layer 126, the second cobalt tungsten cap layer 124 and the low-k dielectric regions 114 may be treated in a plasma process or in a non-plasma process at a substrate temperature between 150° C. and 400° C. in the presence of $H_2$, $N_2$, or $NH_3$, or a combination thereof. In one example, the second cobalt tungsten cap layer 124 and the low-k dielectric regions 114 may be treated with $NH_x$ ($x \leq 3$) radicals and H radicals as described above.

According to other embodiments of the invention, the first cobalt tungsten cap layer 112 may be omitted from the dual damascene interconnect structure 100 depicted in FIGS. 1B-1F.

Figure 2A:
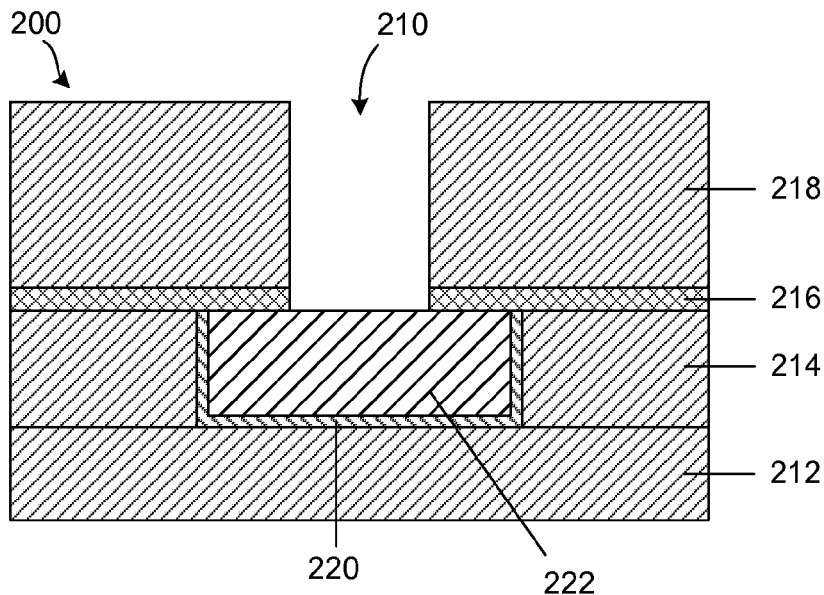
FIGS. 2A-2C schematically show cross-sectional views of additional interconnect structures according to embodiments of the invention.

A dual damascene opening is illustrated in the exemplary embodiments of FIGS. 1A-1F, but embodiments of the invention may be applied to other types of openings and recessed features found in integrated circuit design. In one example, FIG. 2A schematically shows a cross-sectional view of a via interconnect structure according to one embodiment of the invention. The interconnect structure 200 contains a via 210 within a dielectric material 218 over a metallization layer 222 in a dielectric material 214. The interconnect structure 200 further contains a diffusion barrier 220 around the metallization layer 222, an etch stop layer 216, and a substrate 212. The dielectric material 218 can, for example, contain one or more of the low-k dielectric materials described above in reference to the low-k dielectric material 104 in FIG. 1A.

Figure 2B:
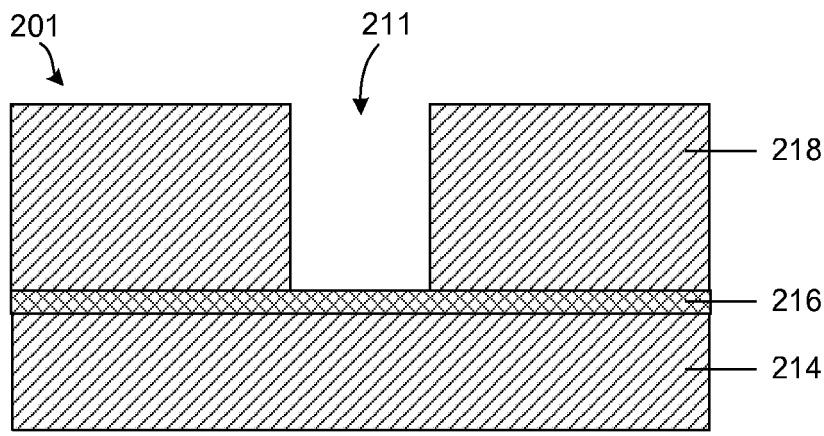
Figure 2C:
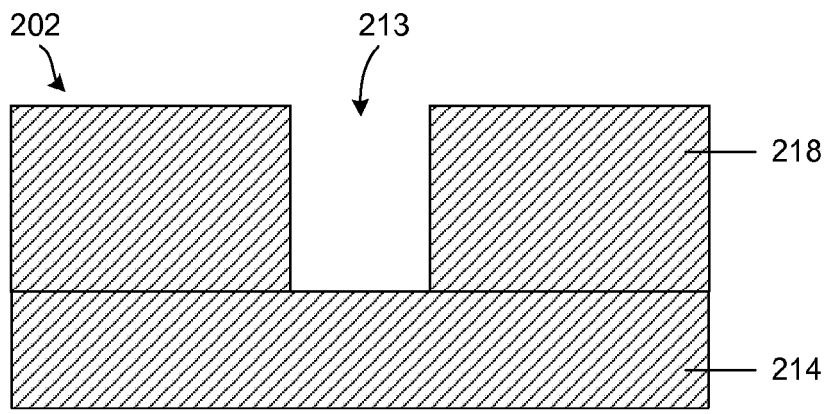

In another example, FIG. 2B schematically shows a cross-sectional view of a trench interconnect structure according to one embodiment of the invention. The trench interconnect structure 201 contains a trench 211 within dielectric material 218 and an etch stop layer 216. In yet another example, FIG. 2C schematically shows a cross-sectional view of a trench interconnect structure according to another embodiment of the invention. The trench interconnect structure 202 contains a trench 213 within dielectric material 218.

As will be appreciated by those skilled in the art, embodiments of the invention can be readily applied to the interconnect structures depicted in FIGS. 2A-2C. For example, a first cobalt tungsten cap layer may be deposited over the metallization layer 222 in the via 210, and the via 210 filled with Cu metal. After the filling, planarization of the Cu metal, and optional treating of the planarized Cu metal, a second cobalt tungsten cap layer may be deposited on the planarized Cu metal. In other examples, the trenches 211 and 213 may be filled with Cu metal and planarized, optionally treated, and a cobalt tungsten cap layer deposited on the planarized Cu metal.

Figure 5:
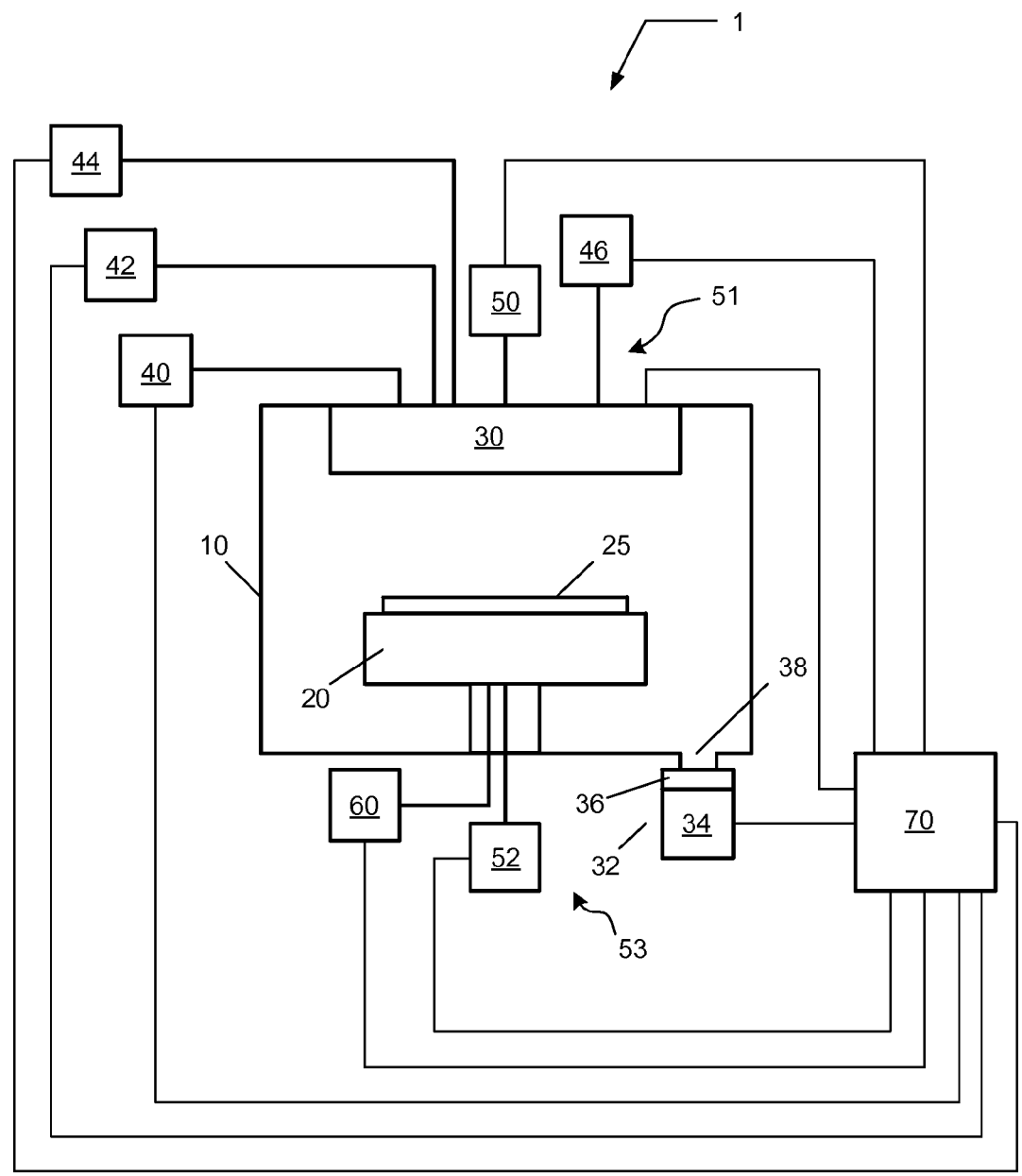
FIG. 5 depicts a schematic view of a processing system for forming cobalt tungsten films according to embodiments of the invention.

FIG. 5 depicts a schematic view of a processing system for processing a substrate in accordance with embodiments of the invention. As those skilled in the art will readily recognize, the processing system 1 can be utilized to perform various deposition processes, substrate treating processes, and substrate nitriding processes. The deposition processes can include chemical vapor deposition (CVD), plasma-enhanced CVD (PECVD), atomic layer deposition (ALD), or plasma-enhanced ALD (PEALD). The processing system 1 includes a process chamber 10 having a substrate holder 20 configured to support a substrate 25 upon which a cobalt tungsten cap layer is to be formed. The process chamber 10 further contains an upper assembly 30 coupled to a first process material supply system 40, a second process material supply system 42, a third process material supply system 44, and a purge gas supply system 46. Additionally, the processing system 1 includes a first power source 50 coupled to the process chamber 10 and configured to optionally generate plasma in the process chamber 10, and a substrate temperature control system 60 coupled to substrate holder 20 and configured to elevate and control the temperature of the substrate 25.

The processing system 1 may be configured to process 200 mm substrates (wafers), 300 mm substrates, or larger-sized substrates. In fact, it is contemplated that the processing system 1 may be configured to process substrates, wafers, or flat panel displays regardless of their size, as would be appreciated by those skilled in the art. Therefore, while aspects of the invention will be described in connection with the processing of a semiconductor substrate, the invention is not limited solely thereto.

The first process material supply system 40, the second process material supply system 42, and the third process material supply system 44 are configured to simultaneously or sequentially introduce a first process material, a second process material, or a third process material to the process chamber 10. Sequential introduction of the first process material, the second process material, and the third process material can be cyclical, or it may be acyclical with variable time periods between introduction of the first, second, and third process materials.

The first process material can, for example, contain a cobalt precursor gas. The cobalt precursor gas can contain $Co_2(O)_8$, $Co_4(CO)_{12}$, $CoCp(CO)_2$, $Co(CO)_3(NO)$, $CO_2(CO)_6$ (HCC'Bu), $Co(acac)_2$, $Co(Cp)_2$, $Co(Me_5 Cp)_2)$, $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, or tricarbonyl allyl cobalt, or a combination of two or more thereof. For instance, the cobalt precursor gas can originate as a solid phase, a liquid phase, or a gaseous phase, and it may be delivered to process chamber 10 in a gaseous phase in a first or second deposition gas with or without the use of a carrier gas.

The second process material can, for example, contain a tungsten precursor gas. In one example, the tungsten precursor gas can contain a tungsten carbonyl precursor gas, for example $W(CO)_6$. In another example, the tungsten precursor gas can contain a tungsten halide precursor gas, for example, $WX_6$ where X=F, Cl, or Br.

The third process material can, for example, contain a reducing gas, a nitriding gas, or a combination thereof, that may be delivered to process chamber 10 with or without the use of a carrier gas. The reducing gas may contain $H_2$ and may be exposed to the substrate 25 as thermally excited $H_2$ (non-plasma excited $H_2$) or plasma excited $H_2$. The nitriding gas may contain $NH_3$, $NH_3$, $N_2$, $NH(CH_3)_2$, $N_2H_4$, or $N_2H_3CH_3$, or a combination of two or more thereof, and may be exposed to the substrate 25 as thermally excited or plasma excited nitriding gas.

Additionally, the purge gas supply system 46 can be configured to introduce a purge gas to process chamber 10. For example, the introduction of purge gas may occur between introduction of the first process material and the second process material, between the second process material and the third process material, or following the introduction of the third process material. The purge gas can comprise an inert gas, such as a noble gas (i.e., helium, neon, argon, xenon, krypton), $N_2$, or $H_2$.

Still referring to FIG. 5, the processing system 1 includes a plasma generation system 51 configured to generate a plasma in the process chamber 10 during formation of the cobalt tungsten film, for example during introduction of the first, second, or third process materials into the process chamber 10. Furthermore the plasma generation system 51 may generate a plasma in the process chamber during introduction of the third process material into the process chamber 10 in a nitriding process. The plasma generation system can include the first power source 50 coupled to the process chamber 10, and configured to couple power to gases in the process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber 10, including the electrode, and plasma. For instance, the impedance match network serves to improve the transfer of RF power to plasma in the process chamber 10 by reducing the reflected power. Match network topologies (e.g. L-type, π-type, T-type, etc.) and automatic control methods are well known to those skilled in the art.

Alternatively, the first power source 50 may include a RF generator an impedance match network, and an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the contents of which are herein incorporated by reference in its entirety.

According to one embodiment of the invention, the processing system 1 includes a substrate bias generation system 53 configured to optionally generate or assist in generating a plasma (through substrate holder biasing) during at least a portion of deposition of a cobalt tungsten cap layer, during substrate treating processes, and during substrate nitriding processes. The substrate bias generation system 53 can include a substrate power source 52 coupled to the process chamber 10, and configured to couple power to substrate 25. The substrate power source 52 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. In one example, the substrate power source 52 may generate plasma in the process chamber 10 through biasing of the substrate holder 20 while the upper assembly 30 is grounded.

Although the plasma generation system 51 and the substrate bias generation system 53 are illustrated in FIG. 5 as separate entities, they may indeed comprise one or more power sources coupled to substrate holder 20.

According to an embodiment of the invention, the processing system 1 may contain an inductive couple plasma (ICP) source (not shown) to generate a plasma in the process chamber 10.

Still referring to FIG. 5, processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system to the substrate holder 20. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1.

In order to improve the thermal transfer between substrate 25 and substrate holder 20, the substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate 25 is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming a cobalt tungsten cap layer on substrate 25, treating the substrate 25, or performing a nitriding process, and suitable for use of the first, second, and third process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. In conventional processing systems, a 300 to 5000 liter per second TMP is generally employed. Moreover, a device for monitoring chamber pressure (not shown) can be coupled to the process chamber 10. The pressure measuring device can, for example, be a capacitance manometer.

The processing system 1 includes a controller 70 that can be used to configure any number of processing elements of the processing system 1, and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs of the processing elements of the processing system 1 as well as monitor outputs from the processing system 1. For example, a program stored in the memory may be utilized to activate the inputs to the aforementioned components of the processing system 1 according to a process recipe in order to perform a deposition process, a treating process, or a nitriding process.

The controller 70 may be implemented as a general purpose computer system that performs a portion or all of the microprocessor based processing steps of embodiments of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing embodiments the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

A plurality of embodiments for integrating cobalt tungsten deposition and cobalt tungsten cap layers into manufacturing of semiconductor devices to improve EM and SM in Cu metallization has been disclosed in various embodiments.

The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
    providing a patterned substrate containing a recessed feature formed in a low-k dielectric material and a first metallization layer at the bottom on the recessed feature;
    forming a first cobalt tungsten cap layer on the first metallization layer using a first cobalt precursor gas and a first tungsten precursor gas, wherein forming the first cobalt tungsten cap layer comprises forming alternating layers of cobalt metal and tungsten metal, alternating layers of cobalt metal and cobalt-rich cobalt tungsten, alternating layers of cobalt metal and tungsten-rich cobalt tungsten, alternating layers of tungsten metal and cobalt-rich cobalt tungsten, or alternating layers of tungsten metal and tungsten-rich cobalt tungsten;
    depositing a barrier layer in the recessed feature, including on the low-k dielectric material and on the first cobalt tungsten cap layer; and
    filling the recessed feature with copper (Cu) metal.

2. The method of claim 1, wherein forming the first cobalt tungsten cap layer comprises:
    exposing the patterned substrate to a first deposition gas containing the first cobalt precursor gas and the first tungsten precursor gas.

3. The method of claim 2, wherein exposing the patterned substrate to the first deposition gas further comprises:
    varying a ratio of a flow rate of the first cobalt precursor gas to a flow rate of the first tungsten precursor gas in the first deposition gas from a first ratio to a second ratio different than the first ratio.

4. The method of claim 1, further comprising:
    exposing the first cobalt tungsten cap layer to thermally excited or plasma excited first nitriding gas selected from a group consisting of $NH_3$, $N_2$, $N_2+H_2$, $NH(CH_3)_2$, $N_2H_4$, or $N_2H_3CH_3$, or a combination thereof.

5. The method of claim 1, wherein the first cobalt precursor gas comprises $CO_2(CO)_8$, $CO_4(CO)_{12}$, $CoCp(CO)_2$, $Co(CO)_3(NO)$, $CO_2(CO)_6(HCC^tBu)$, $Co(acac)_2$, $Co(Cp)_2$, $Co(Me_5Cp)_2)$, $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, or tricarbonyl allyl cobalt, or a combination of two or more thereof.

6. The method of claim 1, wherein the first tungsten precursor gas comprises $W(CO)_6$ or a tungsten halide precursor gas ($WX_6$).

7. The method of claim 1, wherein the first cobalt precursor gas comprises a cobalt carbonyl precursor gas and the first tungsten precursor gas comprises a tungsten carbonyl precursor gas.

8. The method of claim 1, wherein the first cobalt tungsten cap layer is selectively formed on the first metallization layer relative to the low-k dielectric material.

9. The method of claim 1, further comprising:
following the filling, forming a substantially planar surface with Cu paths and low-k dielectric regions; and
forming a second cobalt tungsten cap layer on the Cu paths using a second cobalt precursor gas and a second tungsten precursor gas.

10. The method of claim 9, wherein forming the second cobalt tungsten cap layer comprises:
exposing the patterned substrate to a second deposition gas containing the second cobalt precursor gas and the second tungsten precursor gas.

11. The method of claim 10, wherein the exposing further comprises:
varying a ratio of a flow rate of the second cobalt precursor gas to a flow rate of the second tungsten precursor gas in the second deposition gas from a first ratio to a second ratio different than the first ratio.

12. The method of claim 9, wherein forming the second cobalt tungsten cap layer comprises:
forming alternating layers of cobalt metal and tungsten metal, alternating layers of cobalt metal and cobalt-rich cobalt tungsten mixtures, alternating layers of cobalt metal and tungsten-rich cobalt tungsten mixtures, alternating layers of tungsten metal and cobalt-rich cobalt tungsten mixtures, or alternating layers of tungsten metal and tungsten-rich cobalt tungsten mixtures.

13. The method of claim 9, further comprising:
exposing the second cobalt tungsten cap layer to thermally excited or plasma excited second nitriding gas selected from a group consisting of $NH_3$, $N_2$, $N_2+H_2$, $NH(CH_3)_2$, $N_2H_4$, or $N_2H_3CH_3$, or a combination thereof.

14. The method of claim 9, wherein the second cobalt precursor gas comprises $CO_2(CO)_8$, $CO_4(CO)_{12}$, $CoCp(CO)_2$, $Co(CO)_3(NO)$, $CO_2(CO)_6(HCC^tBu)$, $Co(acac)_2$, $Co(Cp)_2$, $Co(Me_5Cp)_2)$, $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, or tricarbonyl allyl cobalt, or a combination of two or more thereof.

15. The method of claim 9, wherein the second tungsten precursor gas comprises $W(CO)_6$ or a tungsten halide precursor gas $(WX_6)$.

16. The method of claim 9, wherein the second cobalt tungsten cap layer is selectively formed on the Cu paths relative to the low-k dielectric regions.

17. A method of forming a semiconductor device, comprising:
providing a patterned substrate having a substantially planar surface with copper (Cu) paths and low-k dielectric regions; and
forming a cobalt tungsten cap layer on the Cu paths by exposing the patterned substrate to a deposition gas comprising a cobalt precursor gas and a tungsten precursor gas, wherein forming the cobalt tungsten cap layer comprises forming alternating layers of cobalt metal and tungsten metal, alternating layers of cobalt metal and cobalt-rich cobalt tungsten mixtures, alternating layers of cobalt metal and tungsten-rich cobalt tungsten mixtures, alternating layers of tungsten metal and cobalt-rich cobalt tungsten mixtures, or alternating layers of tungsten metal and tungsten-rich cobalt tungsten mixtures.

18. The method of claim 17, wherein exposing the patterned substrate to the deposition gas further comprises:
varying a ratio of a flow rate of the cobalt precursor gas to a flow rate of the tungsten precursor gas in the deposition gas from a first ratio to a second ratio different than the first ratio.

19. The method of claim 17, further comprising:
exposing the cobalt tungsten cap layer to thermally excited or plasma excited nitriding gas selected from a group consisting of $NH_3$, $N_2$, $N_2+H_2$, $NH(CH_3)_2$, $N_2H_4$, or $N_2H_3CH_3$, or a combination thereof.

20. The method of claim 17, wherein the cobalt precursor gas comprises $CO_2(CO)_8$, $CO_4(CO)_{12}$, $CoCp(CO)_2$, $Co(CO)_3(NO)$, $CO_2(CO)_6(HCC^tBu)$, $Co(acac)_2$, $Co(Cp)_2$, $Co(Me_5Cp)_2)$, $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, or tricarbonyl allyl cobalt, or a combination of two or more thereof.

21. The method of claim 17, wherein the tungsten precursor gas comprises $W(CO)_6$ or a tungsten halide precursor gas $(WX_6)$.

22. The method of claim 17, wherein the cobalt precursor gas comprises a cobalt carbonyl precursor gas and the tungsten precursor gas comprises a tungsten carbonyl precursor gas.

23. The method of claim 17, wherein the cobalt tungsten cap layer is selectively formed on the Cu paths relative to the low-k dielectric regions.

24. A method of forming a semiconductor device, comprising:
providing a patterned substrate having a substantially planar surface with copper (Cu) paths and low-k dielectric regions; and
forming a cobalt tungsten cap layer on the Cu paths by exposing the patterned substrate to a deposition gas comprising a cobalt precursor gas and a tungsten precursor gas, wherein the cobalt tungsten cap layer has a varying cobalt/tungsten ratio from an external surface of the cobalt tungsten cap layer to an interface between the cobalt tungsten cap layer and the Cu paths.

25. The method of claim 24, wherein exposing the patterned substrate to the deposition gas further includes varying a ratio of a flow rate of the cobalt precursor gas to a flow rate of the tungsten precursor gas in the deposition gas from a first ratio to a second ratio different than the first ratio.

26. The method of claim 24, wherein forming the cobalt tungsten cap layer comprises:
forming alternating layers of cobalt metal and tungsten metal, alternating layers of cobalt metal and cobalt-rich cobalt tungsten mixtures, alternating layers of cobalt metal and tungsten-rich cobalt tungsten mixtures, alternating layers of tungsten metal and cobalt-rich cobalt tungsten mixtures, or alternating layers of tungsten metal and tungsten-rich cobalt tungsten mixtures.

27. The method of claim 24, further comprising:
exposing the cobalt tungsten cap layer to thermally excited or plasma excited nitriding gas selected from a group consisting of $NH_3$, $N_2$, $N_2+H_2$, $NH(CH_3)_2$, $N_2H_4$, or $N_2H_3CH_3$, or a combination thereof.

* * * * *